United States Patent
Ozaki et al.

(10) Patent No.: US 10,619,739 B2
(45) Date of Patent: Apr. 14, 2020

(54) PISTON RING

(71) Applicant: NIPPON PISTON RING CO., LTD., Saitama-shi, Saitama-ken (JP)

(72) Inventors: Takuya Ozaki, Ichinoseki (JP); Hiroyuki Sugiura, Ichinoseki (JP)

(73) Assignee: NIPPON PISTON RING CO., LTD, Saitama-shi, Saitama (JP)

( * ) Notice: Subject to any disclaimer, the term of this patent is extended or adjusted under 35 U.S.C. 154(b) by 180 days.

(21) Appl. No.: 15/739,347

(22) PCT Filed: Jul. 29, 2016

(86) PCT No.: PCT/JP2016/072291
§ 371 (c)(1),
(2) Date: Dec. 22, 2017

(87) PCT Pub. No.: WO2017/022659
PCT Pub. Date: Feb. 9, 2017

(65) Prior Publication Data
US 2018/0180182 A1 Jun. 28, 2018

(30) Foreign Application Priority Data
Jul. 31, 2015 (JP) .................................. 2015-152546

(51) Int. Cl.
*F16J 9/26* (2006.01)
*F02F 5/00* (2006.01)
(Continued)

(52) U.S. Cl.
CPC ............ *F16J 9/26* (2013.01); *C23C 14/0605* (2013.01); *C23C 14/325* (2013.01); *C23C 28/04* (2013.01);
(Continued)

(58) Field of Classification Search
USPC .................................. 277/442; 428/336, 408
See application file for complete search history.

(56) References Cited

U.S. PATENT DOCUMENTS

| 6,962,751 B2 * | 11/2005 | Fukui .................... C04B 41/009 |
| | | 428/408 |
| 2009/0011225 A1 | 1/2009 | Moronuki et al. |

(Continued)

FOREIGN PATENT DOCUMENTS

| DE | 102010052971 A1 | 5/2012 |
| JP | 5-208806 A | 8/1993 |

(Continued)

OTHER PUBLICATIONS

Communication dated Jul. 12, 2018, from the European Patent Office in counterpart European Application No. 16832938.1.
(Continued)

*Primary Examiner* — Archene A Turner
(74) *Attorney, Agent, or Firm* — Sughrue Mion, PLLC (57) ABSTRACT

To provide a piston ring comprising a hard carbon film that is easy to form and exhibits excellent wear resistance. The above-described problem is solved by having a hard carbon film 4 formed on at least an outer peripheral sliding surface 11 of a piston ring base material 1, wherein the hard carbon film 4 is a laminated film comprising a plurality of layers, and is configured so as to contain boron within a range of an atomic density of $0.2 \times 10^{22}$ atoms/cm$^3$ to $2.0 \times 10^{22}$ atoms/cm$^3$ inclusive. This hard carbon film 4 may be configured to have an sp$^2$ component ratio within a range of 40% to 80% inclusive, measured in a TEM-EELS spectrum formed by combining electron energy loss spectroscopy (EELS) with a transmission electron microscope (TEM), and a hydrogen content within a range of 0.1 atom % to 5 atom % inclusive.
(Continued)

Further, a total thickness of this hard carbon film 4 may be configured to be within a range of 0.5 μm to 20 μm inclusive.

6 Claims, 8 Drawing Sheets

(51) Int. Cl.
 *C23C 14/32* (2006.01)
 *C23C 14/06* (2006.01)
 *C23C 28/04* (2006.01)
 *C23C 28/00* (2006.01)

(52) U.S. Cl.
 CPC .......... *C23C 28/046* (2013.01); *C23C 28/048* (2013.01); *C23C 28/44* (2013.01); *F02F 5/00* (2013.01)

(56) References Cited

U.S. PATENT DOCUMENTS

| | | |
|---|---|---|
| 2012/0248711 A1 | 10/2012 | Iwashita et al. |
| 2013/0136861 A1 | 5/2013 | Barenreuter et al. |
| 2013/0140776 A1* | 6/2013 | Kennedy ............... C23C 14/025 427/419.1 |
| 2015/0137457 A1 | 5/2015 | Iwashita et al. |
| 2016/0003356 A1 | 1/2016 | Ozaki et al. |

FOREIGN PATENT DOCUMENTS

| | | | |
|---|---|---|---|
| JP | 2005-240180 A | | 9/2005 |
| JP | 200799949 A | | 4/2007 |
| JP | 2007-170467 | * | 5/2007 |
| JP | 2007-169698 A | | 7/2007 |
| JP | 2008-286354 A | | 11/2008 |
| JP | 2012-202522 A | | 10/2012 |
| JP | 2013-529249 A | | 7/2013 |
| JP | 2013-155420 A | | 8/2013 |
| JP | 2014-224239 | * | 12/2014 |
| WO | 2014/133095 A1 | | 9/2014 |
| WO | 2014-196259 | * | 12/2014 |

OTHER PUBLICATIONS

International Search Report for PCT/JP2016/072291, dated Sep. 6, 2016 (PCT/ISA/210).
Written Opinion of the International Searching Authority for PCT/JP2016/072291, dated Sep. 6, 2016 (PCT/ISA/237).

\* cited by examiner

PISTON RING

CROSS REFERENCE TO RELATED APPLICATIONS

This application is a National Stage of International Application No. PCT/JP2016/072291 filed Jul. 29, 2016, claiming priority based on Japanese Patent Application No. 2015-152546, filed Jul. 31, 2015, the contents of all of which are incorporated herein by reference in their entirety.

FIELD OF THE INVENTION

The present invention relates to a piston ring provided with a hard carbon film exhibiting excellent wear resistance.

BACKGROUND ART

Piston rings used in internal combustion engines have been increasingly used under harsh high-temperature, high-pressure environments in recent years, demanding further improvement in wear resistance, initial running-in property, low friction, and the like. In response to such demands, Patent Document 1, for example, proposes a piston ring provided with a carbon-based coating exhibiting low friction and wear resistance. Specifically, Patent Document 1 proposes a piston ring having a laminated coating comprising two types of layers with different hardnesses laminated in at least two layers, a hardness difference between the two types of layers being 500 to 1700 HV, a high hardness layer having a thickness greater than or equal to that of a low hardness layer, and the coating as a whole having a thickness of 5.0 μm or greater. At this time, the low hardness layer is formed by sputtering, and the high hardness layer is formed by ion plating.

Further, Patent Document 2 proposes a piston ring having an amorphous hard carbon coating excellent in adhesion to a piston ring base material, high in hardness, and excellent in wear resistance. Specifically, Patent Document 2 proposes a piston ring having a first amorphous hard carbon layer formed on a surface of the piston ring base material and substantially comprising only carbon without hardly any hydrogen, and a second amorphous hard carbon layer formed on a surface of the first amorphous hard carbon layer and substantially comprising only carbon. When viewed from a cross section, a transmission electron microscopic image of the first amorphous hard carbon layer is brighter than that of the second amorphous hard carbon layer.

PATENT DOCUMENTS

Patent Document 1: Japanese Laid-Open Patent Application No. 2012-202522
Patent Document 2: Japanese Laid-Open Patent Application No. 2007-169698

SUMMARY OF THE INVENTION

Problems to be Solved by the Invention

Nevertheless, the technology of Patent Document 1 is a multi-layered structure having layers of different hardnesses alternately repeatedly laminated by different film-forming means, making formation of the film complex. Further, with the high hardness layer having a thickness of 5 nm to 90 nm, the high hardness layer cannot always be maintained, making it difficult to maintain wear resistance. Furthermore, while the technology of Patent Document 2 describes the relationship between brightness of the transmission electron microscopic image and density as well as adhesion with the base material, whether or not the layers are amorphous hard carbon layers high in hardness and excellent in wear resistance had not been adequately studied.

The present invention was made to resolve the above-described problems, and it is therefore an object of the present invention to provide a piston ring comprising a hard carbon film that is easy to form and exhibits excellent wear resistance.

Means for Solving the Problems

A piston ring according to the present invention for resolving the above-described problems comprises a hard carbon film formed on at least an outer peripheral sliding surface of a piston ring base material. The hard carbon film is a laminated film comprising a plurality of layers, and configured so as to contain boron within a range of an atomic density of $0.2 \times 10^{22}$ atoms/cm$^3$ to $2.0 \times 10^{22}$ atoms/cm$^3$ inclusive.

According to this present invention, the hard carbon film which is a laminated film contains boron within the range of the above-described atomic densities, making it possible to increase wear resistance.

In the piston ring according to the present invention, the hard carbon film may be configured to have an sp$^2$ component ratio within a range of 40% to 80% inclusive, measured in a TEM-EELS spectrum formed by combining electron energy loss spectroscopy (EELS) with a transmission electron microscope (TEM), and a hydrogen content within a range of 0.1 atom % to 5 atom % inclusive.

In the piston ring according to the present invention, a total thickness of the hard carbon film may be configured to be within a range of 0.5 μm to 20 μm, inclusive.

In the piston ring according to the present invention, the hard carbon film may be configured to be formed on a hard carbon foundation film having a thickness within a range of 0.05 μm to 0.5 μm, inclusive.

In the piston ring according to the present invention, an amount of macroparticles appearing on a surface of the hard carbon film may be configured to be within a range of 0.1% to 10% inclusive by area ratio.

In the piston ring according to the present invention, a surface hardness of the hard carbon film may be configured to be within a range of 10 GPa to 25 GPa inclusive at an indentation hardness $H_{IT}$ (15-mN load) when measured by a nanoindentation method.

Effect of the Invention

According to the piston ring of the present invention, it is possible to provide a piston ring having a hard carbon film that is easy to form and exhibits excellent wear resistance.

EMBODIMENTS OF THE INVENTION

The following describes a piston ring according to the present invention with reference to the drawings. The present invention is not limited to the embodiment below as long as the technical characteristics of the present invention are included.

A piston ring 10 according to the present invention, as illustrated in FIGS. 1A to 4B, has a hard carbon film 4 formed on at least an outer peripheral sliding surface 11 of a piston ring base material 1. Then, the hard carbon film 4 is a laminated film comprising a plurality of layers, and is configured so as to contain boron within a range of an atomic density of $0.2 \times 10^{22}$ atoms/cm$^3$ to $2.0 \times 10^{22}$ atoms/cm$^3$ inclusive. The hard carbon film 4 that contains boron within this range of atomic density has high wear resistance.

In this hard carbon film 4, an sp$^2$ component ratio measured in a TEM-EELS spectrum is desirably within a range of 40% to 80% inclusive, and a hydrogen content is desirably within a range of 0.1 atom % to 5 atom % inclusive. Furthermore, the amount of macroparticles appearing on the surface is desirably within a range of 0.1% to 10% inclusive by area ratio, in particular, from the viewpoint of wear resistance.

The following describes the components of the piston ring in detail.

(Piston Ring Base Material)

For the piston ring base material 1, the materials used as the base material of the piston ring 10 are various and not particularly limited. For example, materials such as various steel materials, stainless steel materials, casting materials, and cast steel materials, can be applied. Among these, examples include a martensitic stainless steel, a spring steel (SUP9, SUP10), a silicon chrome steel (SWOSC-V), and the like.

A nitriding treatment may be performed in advance on the piston ring base material 1 to form a nitride layer (not illustrated). Or, a wear-resistant coating (not illustrated), such as a Cr—N based, Cr—B—N based, Cr—B—V—N based, Cr—B—V—Ti—N based, or Ti—N based film, may be formed in advance. Among these, a Cr—N based, Cr—B—N based, Cr—B—V—N based, or Ti—N based wear-resistant coating is preferably formed. It should be noted that the piston ring 10 according to the present invention exhibits excellent wear resistance even without such a nitriding treatment or formation of a Cr or Ti based wear-resistant coating, and thus the nitriding treatment and formation of the Cr or Ti based wear-resistant coating are not necessarily required.

The piston ring base material 1 may be pretreated as necessary. Such a pretreatment is preferably performed by polishing the surface to adjust surface roughness. Adjustment of the surface roughness is preferably performed by, for example, methods such as lapping and polishing the surface of the piston ring base material 1 using diamond abrasive grains. Such an adjustment of surface roughness makes it possible to adjust the surface roughness of the piston ring base material 1 to within a preferred range of 0.02 μm to 0.07 μm inclusive as an arithmetic mean roughness Ra based on JIS B0601 (2001) and ISO 4287 (1997). The piston ring base material 1 thus adjusted can be preferably applied as a pretreatment before formation of a hard carbon foundation film 3 described later, or as a pretreatment for a foundation film 2 provided in advance before formation of the hard carbon foundation film 3.

(Foundation Film)

Figure 4A:
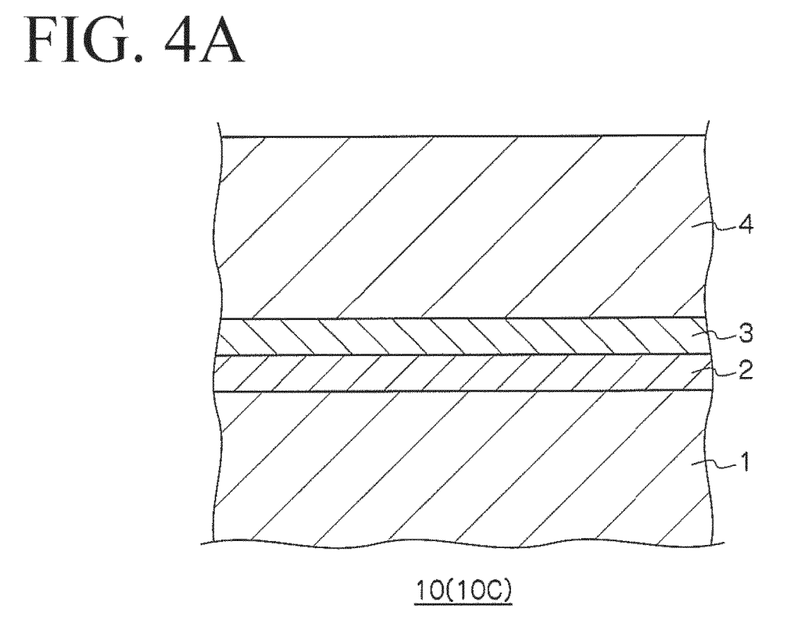
FIGS. 4A and 4B are schematic cross-sectional views illustrating yet other examples of the sliding surface of the piston ring according to the present invention.
Figure 4B:
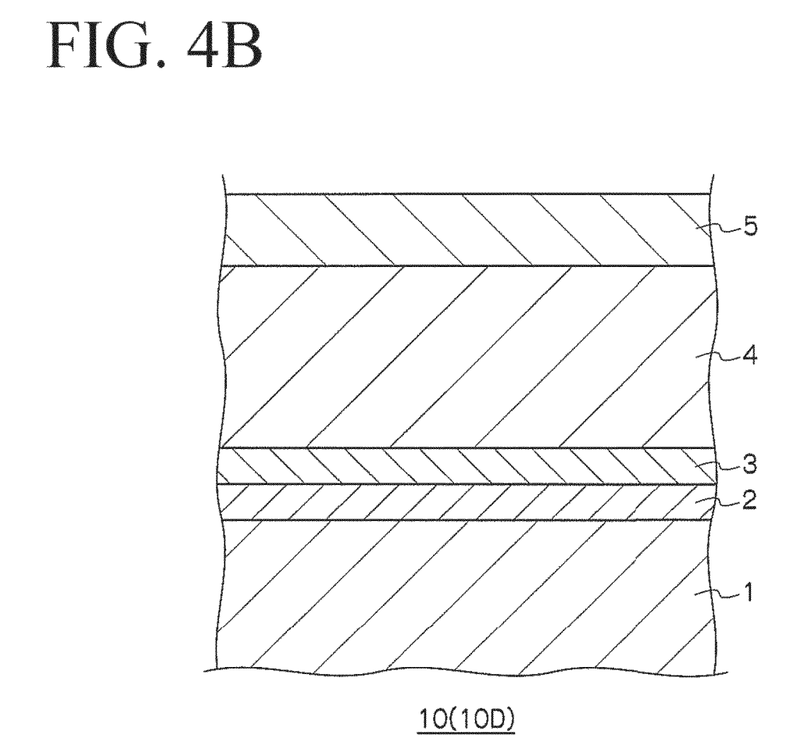

The foundation film 2 comprising titanium, chromium, or the like may be provided to the piston ring base material 1, as illustrated in FIGS. 4A and 4B. The foundation film 2 does not necessarily have to be provided, and thus formation is optional. The foundation film 2 comprising titanium, chromium, or the like may be formed by various film-forming means. For example, the foundation film 2 comprising titanium, chromium, or the like may be formed by applying film-forming means such as a vacuum deposition method, a sputtering method, and an ion plating method. While a thickness of the foundation film 2 is not particularly limited, a thickness within a range of 0.05 μm to 2 μm inclusive is preferred. Note that the foundation film 2 is preferably formed on at least the outer peripheral sliding surface 11 on which the piston ring 10 slides upon contact with a cylinder liner (not illustrated). However, the foundation film 2 may be formed on other surfaces, such as a top surface 12, a bottom surface 13, and an inner peripheral surface 14 of the piston ring 10, for example.

The foundation film 2 can be formed by means such as a vacuum depositing method or an ion plating method for setting the piston ring base material 1 into a chamber, creating a vacuum in the chamber, performing pre-heating, ion cleaning, and the like, and introducing an inert gas, for example.

This foundation film 2, as illustrated in FIGS. 4A and 4B, may be directly formed on the piston ring base material 1, and the hard carbon foundation film 3 described later is desirably formed on the above-mentioned foundation film 2. The foundation film 2 improves the adhesion between the piston ring base material 1 and the hard carbon foundation film 3 as well as the hard carbon film 4 and, by forming the hard carbon foundation film 3 on the foundation film 2, can further suppress nucleation and nuclear growth when the hard carbon foundation film 3 is formed at low speed. As a result, the hard carbon film 4 formed on the hard carbon foundation film 3 can be formed as a smooth film having little surface unevenness.

(Hard Carbon Foundation Film)

The hard carbon foundation film 3 is provided on the piston ring base material 1. Specifically, the hard carbon foundation film 3 is formed on at least the outer peripheral sliding surface 11 on which the piston ring 10 slides upon contact with the cylinder liner (not illustrated). However, the hard carbon foundation film 3 may be optionally formed on other surfaces, such as the top surface 12, the bottom surface 13, and the inner peripheral surface 14 of the piston ring 10, for example.

The hard carbon foundation film 3, as illustrated in FIGS. 1A to 3, may be directly provided on the piston ring base material 1, may be provided on the above-mentioned surface after the nitriding treatment or wear-resistant coating, or may be provided on the above-mentioned foundation film 2 comprising a titanium film or the like, as illustrated in FIGS. 4A and 4B. It should be noted that the hard carbon film 4 described later is preferably provided directly on the hard carbon foundation film 3 without another film being interposed therebetween.

The hard carbon foundation film 3 may have the same components those of as the hard carbon film 4 described later, including boron, or may be a hard carbon film that does not contain boron. This hard carbon foundation film 3 is formed in a previous stage process where the hard carbon film 4 is formed and thus having the components be the same as those of the hard carbon film 4 described later, including boron, is advantageous from the perspective of ease of manufacture as well as the perspective of improvement in wear resistance.

The hard carbon foundation film 3 can be formed by film-forming means such as an ion plating method based on vacuum arc discharge using a carbon target. For example, when the hard carbon foundation film 3 is formed by an ion plating method based on vacuum arc discharge (hereinafter "arc ion plating method"), film formation can be achieved specifically by setting the piston ring base material 1 or the piston ring base material 1 provided with the wear-resistant coating, the foundation film 2, or the like in advance into a chamber, creating a vacuum in the chamber, and discharging carbon plasma from the carbon target. Note that the hard carbon foundation film 3 containing boron can be obtained by forming the film using a carbon target that contains boron. The boron content in the carbon target is set so that the boron content in the hard carbon foundation film 3 after film formation is within a preferred range. For example, when the boron is to be contained within the range of an atomic density of $0.2 \times 10^{22}$ atoms/cm$^3$ to $2.0 \times 10^{22}$ atoms/cm$^3$ inclusive, similar to the hard carbon film 4 described later, the carbon target may contain a predetermined amount of boron to ensure that the atomic density is within the above-described range.

Note that the hard carbon foundation film 3 may be formed by performing control so as to decrease, among the film-forming conditions of the hard carbon film 4 described later, the film-forming speed. That is, the hard carbon foundation film 3 may be formed under low-speed film-forming conditions. Examples of methods for decreasing such a film-forming condition include means for decreasing the arc current in an arc ion plating method. Among such methods, film formation by an arc ion plating method with an arc current within a range of 40 A to 100 A and a pulse bias voltage within a range of −2000 V to −100 V is preferred.

The arc current described above when this hard carbon foundation film 3 is formed upon decreasing the film-forming speed is smaller than the arc current when forming the hard carbon film 4 described later. This offers the advantage of making it possible to suppress adhesion defects caused by sudden increases in arc current that readily occur when the hard carbon film 4 is formed without forming the hard carbon foundation film 3 on the piston ring base material 1. Furthermore, formation of the hard carbon foundation film 3 by a small arc current also offers the advantage of making it possible to suppress nucleation as well as nuclear growth, and suppress increases in macroparticles. Such a suppression of increases in macroparticles facilitates formation of the hard carbon film 4 described later as a smooth film unaffected by the hard carbon foundation film 3 and having little surface unevenness.

When decreased, the arc current is preferably set to an arc current value that is no more than 80% of the arc current value during formation of the hard carbon film 4. When formed using an arc current value that is no more than 80% of the arc current value during formation of the hard carbon film 4, the hard carbon foundation film 3 can effectively exhibit the function of a hard carbon foundation film 3. That is, the hard carbon foundation film 3 formed under low-speed film-forming conditions achieves suppression of nucleation as well as nuclear growth. As a result, the hard carbon film 4 formed on the hard carbon foundation film 3 can suppress adhesion defects caused by sudden increases in arc current, and can suppress increases in macroparticles. The suppression of increases in macroparticles makes it possible to form the hard carbon film 4 as a smooth film unaffected by the hard carbon foundation film 3 and having little surface unevenness. As a result, wear resistance can be improved. It should be noted that the arc current value at this time preferably is given a lower limit of 50% of the arc current value during formation of the hard carbon film 4 to ensure favorable action as the hard carbon foundation film 3.

The above-described action of the hard carbon foundation film 3 formed under low-speed film-forming conditions can be effectively realized with a thickness within a range of 0.05 μm to 0.5 μm inclusive. When the thickness is too thin, such as less than 0.05 μm, the problem arises that the macroparticle suppression effect cannot be achieved. On the other hand, when the thickness is too thick, such as exceeding 0.5 μm, the film-forming speed of the hard carbon film decreases, resulting in the problem of higher cost.

The hardness of the hard carbon foundation film 3 thus formed is within a range of about 2000 HV to 4000 HV (0.05) by Vickers hardness. It should be noted that, with the hard carbon foundation film 3 being too thin, resulting in difficulties in Vickers hardness measurement, evaluation was performed by Vickers hardness (JIS B7725, ISO 6507) with the film thickly formed to about 5 μm under the same film-forming conditions. The measurement can be made using a Vickers hardness tester (manufactured by Future-Tech) or the like, and "HV (0.05)" indicates the Vickers hardness at a load of 50 gf. Further, when the hardness of this hard carbon foundation film 3 is measured by a nanoindentation method, the hardness is within a range of 20 GPa to 45 GPa inclusive at an indentation hardness $H_{IT}$ (15-mN load) thereof. Measurement by the nanoindentation method can be made using a nanoindenter manufactured by Elionix, for example.

(Hard Carbon Film)

The hard carbon film 4 is formed on at least the outer peripheral sliding surface 11 on which the piston ring 10 slides upon contact with the cylinder liner (not illustrated), as illustrated in FIGS. 1A, 1B, 2, and 4A. Note that the hard carbon film 4 may be optionally formed on surfaces other than the outer peripheral sliding surface 11, such as the top surface 12, the bottom surface 13, and the inner peripheral surface 14 of the piston ring 10, for example.

The hard carbon film 4 is a laminated film (also referred to as a nano-laminated film) comprising a plurality of layers, and may be a film obtained by laminating layers having the same thickness or layers having different thicknesses, a gradient film laminated so as to gradually become thicker or thinner, or a laminated film comprising a variety of other laminated forms. While the thickness of the individual layers that constitute the laminated film is not particularly limited, the thickness is preferably within a range of 1 nm to 20 nm inclusive, and more preferably within a range of 3 nm to 10 nm inclusive, per layer. Such a hard carbon film 4 that is a laminated film obtained by laminating thin layers is excellent in wear resistance.

The total thickness of the hard carbon film 4 comprising a laminated film is preferably within a range of 0.5 µm to 20 µm inclusive. The total thickness of the hard carbon film 4 may be within a relatively thin range of 0.5 µm or more and less than 2 µm, or within a relatively thick range of 2 µm to 20 µm inclusive. While the initial running-in property and the wear resistance can be improved even if the total thickness of the hard carbon film 4 is thin, a thick thickness results in the advantage of further maintaining these effects.

Figure 6:
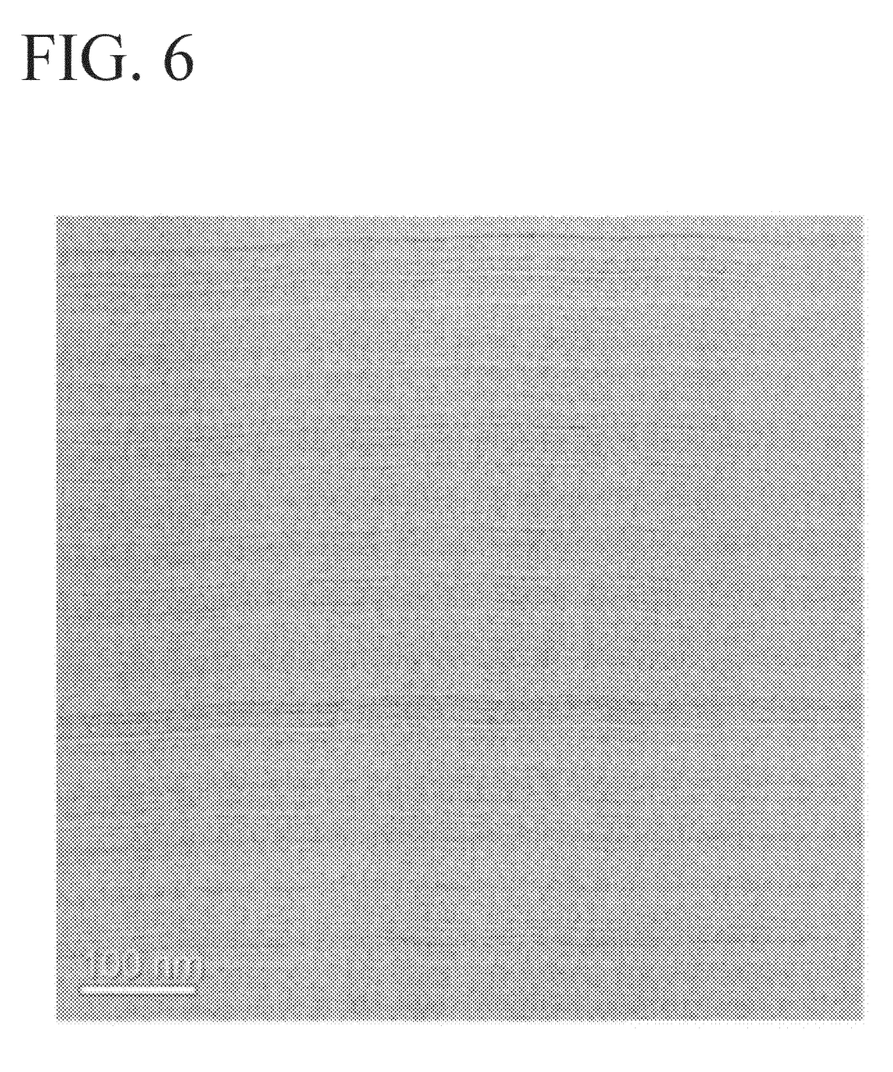
FIG. 6 is a cross-sectional TEM image of the hard carbon film comprising a laminated film.

The hard carbon film 4 comprising a laminated film is preferably formed by an arc ion plating method with an arc current within a range of 80 A (where the value is greater than the arc current of the hard carbon foundation film 3) to 120 A, and a pulse bias voltage within a range of −2000 V to −100 V. FIG. 6 is a cross-sectional TEM image of the hard carbon film 4 comprising a laminated film. Such a laminated film may be formed by, for example, repeatedly changing the film-forming conditions, such as the arc current and bias voltage, over time.

The hard carbon film 4 may be formed by alternately applying at least two different bias voltages in pulses. As an example, 1) a predetermined low bias voltage and a predetermined high bias voltage can be alternately applied in pulses; for example, the film may be formed by alternately applying a −140 V low bias voltage and a −220 V high bias voltage in pulses; 2) a predetermined low bias voltage and a gradually increasing bias voltage can be alternately applied in pulses as pulse voltages; for example, the film may be formed by alternately applying a −140 V low bias voltage and a high bias voltage that gradually increases by −160 V increments from −220 V in pulses; or 3) a predetermined low bias voltage and a predetermined high bias voltage can be alternately applied in pulses; for example, the film may be formed by applying a −140 V low bias voltage, a −220 V high bias voltage, a −150 V low bias voltage, and a −1800 V high bias voltage in pulses in that cycle order. It should be noted that examples of film formation by alternately applying at least two different bias voltages in pulses are not limited to the above 1) to 3), and other examples may be applied. Furthermore, the repeated count of the pulse bias voltage is set so that the thickness of the nano-laminated film is within the range described above.

In the present invention, such a hard carbon film 4 contains boron, making it possible to remarkably improve the wear resistance thereof. The boron in the hard carbon film 4 is preferably contained within a range of an atomic density of $0.2 \times 10^{22}$ atoms/cm$^3$ to $2.0 \times 10^{22}$ atoms/cm$^3$ inclusive. Note that a remarkable increase in wear resistance could not be achieved when the atomic density of the boron was less than $0.2 \times 10^{22}$ atoms/cm$^3$. Further, containing the boron at an atomic density that exceeds $2.0 \times 10^{22}$ atoms/cm$^3$ was in itself difficult.

In the present application, the atomic density of boron in the hard carbon film 4 is expressed by the measurement result by secondary ion mass spectrometry in dynamic mode (D-SIMS) in which a sample is destructively measured while scraped. In the measurement by secondary ion mass spectrometry, the atomic density of boron is quantified based on sensitivity in the hard carbon film 4. While the content of the boron should be calculated using the atomic density of the hard carbon film 4 that does not contain boron as standard, in the present application (including the measurement results of the examples described later), the content of the boron is calculated in the examples described later using the known atomic density ($1.76 \times 10^{23}$ atoms/cm$^3$) of a diamond as the atomic density of the hard carbon film 4.

The hard carbon film 4 containing boron can be obtained by forming the film using a carbon target that contains boron. The content of the boron in the carbon target is set so that the atomic density of the boron included in the hard carbon film 4 after film formation is within the above-described range, and a predetermined amount of boron is contained in the carbon target so that the atomic density is within the range of $0.2 \times 10^{22}$ atoms/cm$^3$ to $2.0 \times 10^{22}$ atoms/cm$^3$ inclusive.

The hard carbon film 4 is formed under film-forming conditions that do not substantially cause containment of hydrogen. As a result, hydrogen is contained within the range of 0.1 atom % to 5 atom % inclusive. Thus, this hard carbon film 4 contains just a slight amount of hydrogen and a slight amount of boron in addition to carbon. In the present invention, formation of this hard carbon film 4 and the above-mentioned hard carbon foundation film 3 is performed under conditions that do not include hydrogen components. The hard carbon foundation film 3 and the hard carbon film 4 can be preferably formed by an arc ion plating method using a carbon target that contains boron. As a result, the hard carbon foundation film 3 and the hard carbon film 4 merely do not substantially contain or unavoidably contain hydrogen components. The degree of "do not substantially contain" and "unavoidably contain" means that the hydrogen content in the hard carbon foundation film 3 and the hard carbon film 4 is 5 atom % or less.

Figure 5:
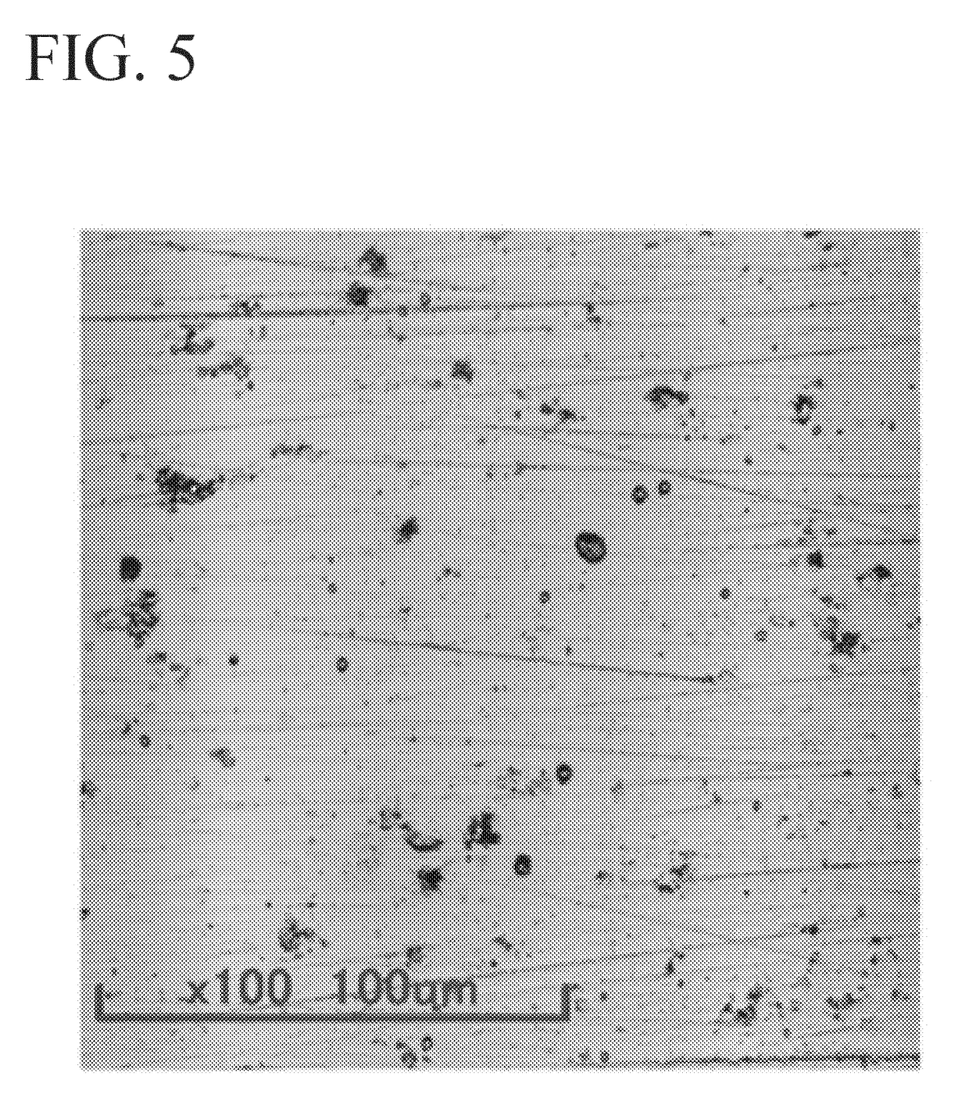
FIG. 5 is a surface image of a hard carbon film of Example 1 showing macroparticles.

The hard carbon film 4 is directly provided on the hard carbon foundation film 3 that is formed under low-speed film-forming conditions to achieve suppression of nucleation and nuclear growth, and suppression of increases in macroparticles, and therefore can be formed as a smooth film having little surface unevenness. The amount of macroparticles appearing on the surface of the hard carbon film 4 is within the range of 0.1% to 10% inclusive by area ratio. As a result, it is possible to exhibit excellent wear resistance and initial running-in property. When the amount of macroparticles exceeds 10% by area ratio, the unevenness of the surface may increase, making it no longer possible to achieve excellent wear resistance. On the other hand, when the amount of macroparticles is less than 0.1% by area ratio, excellent wear resistance can be achieved, but film formation in itself may be difficult, resulting in difficulties in manufacturing control and cost aspects. It should be noted that FIG. 5 is a surface image of a hard carbon film (hard carbon film containing boron) of Example 1 showing macroparticles.

The area ratio of the amount of macroparticles can be found by image analysis using a confocal microscope (OPTELICS H1200) manufactured by Lasertec. Specifically, an image of the piston ring outer periphery (100× objective lens, monochrome confocal image) was taken and subjected to automatic binarization. The threshold value was determined by a discriminant analysis method, adjustments were made so as to exclude polishing flaws, and then the area ratio was extracted from the binarized image. The area ratio of macroparticles was obtained by measuring any five locations on the film and taking the average of the results.

In the present invention, the hard carbon film 4 comprising a laminated film is provided on the hard carbon foundation film 3, resulting in the advantage that film peeling can be further suppressed. This is because, among the at least two different types of bias voltages for forming the hard carbon film 4, a film formed using the low bias voltage functions as a stress relaxing film. As a result, the hard carbon film 4 acts so as to reduce the load applied to the interface between the piston ring base material 1 and the hard carbon foundation film 3. Further, when the foundation film 2 is formed, the hard carbon film 4 acts so as to reduce the load applied to the interface between the foundation film 2 and the hard carbon foundation film 3.

The piston ring 10 provided with such a hard carbon film 4 is capable of eliminating coating peeling at gaps hit hard when temperature is applied, and is therefore particularly preferred.

The hardness of the hard carbon film 4 is within a range of about 1000 HV to 2000 HV (0.05) by Vickers hardness. Further, the hardness of the hard carbon film 4 is within a range of 10 GPa to 25 GPa inclusive at an indentation hardness $H_{IT}$ (15-mN load) when measured by a nanoindentation method. It should be noted that Vickers hardness (JIS B7725, ISO 6507) can be measured using a micro Vickers hardness tester (manufactured by Future-Tech) or the like, and "HV (0.05)" indicates the Vickers hardness at a load of 50 gf. Further, similar to the above, measurement by a nanoindentation method can be made using a nanoindenter manufactured by Elionix, for example.

A "hard carbon film" is a film in which a carbon bond $sp^2$ represented by graphite and a carbon bond $sp^3$ represented by diamond are mixed together. An "$sp^2$ component ratio" expresses the component ratio ($sp^2/(sp^2+sp^3)$) of the graphite component ($sp^2$) to the graphite component ($sp^2$) and the diamond component ($sp^3$) of the hard carbon film.

The hard carbon film 4 preferably has an $sp^2$ component ratio within the range of 40% to 80% inclusive as measured by a TEM-EELS formed by combining electron energy loss spectroscopy (EELS) with a transmission electron microscope (TEM). An $sp^2$ component ratio of less than 40% results in the diamond component ($sp^3$) being the main component, causing the film to be fine but low in toughness, and therefore is not preferred for formation of a hard carbon film. An $sp^2$ component ratio that exceeds 80% results in the graphite component ($sp^2$) being the main component, making formation of the hard carbon film difficult, and therefore is not preferred. Such a covalent bond ratio can be measured using an EELS analyzer (manufactured by Gatan; model 863GIF Tridiem). This measurement can be made by the steps below.

(1) The EELS spectrum is measured by the EELS analyzer. The pre-peak area is fit using a linear function, and the post-peak area is fit using a cubic function to the measured EELS spectrum to standardize the peak intensity. (2) Subsequently, the diamond data and the graphite data are compared, and the energy is calibrated with the peak start position aligned. (3) The surface area within a range of 280 eV to 310 eV is found for the calibrated data. (4) The area is divided into two peaks (one being an $sp^2$ peak and the other being a CH and an amorphous peak) within a range of 280 eV to 295 eV, and the peak area near 285 eV is found. (5) The surface area within the 280 eV to 310 eV range of (3) above, and the peak area near 285 eV of (4) above are determined. For this ratio, the $sp^2$ component ratio is found from relative values given a graphite value of 100 and a diamond value of 0. The value thus found is the $sp^2$ component ratio.

It should be noted that the $sp^2$ component ratio of the hard carbon film is evaluated upon identifying a plurality of points at an equal interval in the thickness direction of the film as measurement points. While not particularly limited, the number of measurement points may be 10 as described in the examples described later. In the present application, the "$sp^2$ component ratio" obtained by the plurality of measurement points is expressed as an average value of the film.

(Outermost Surface Film)

Figure 1A:
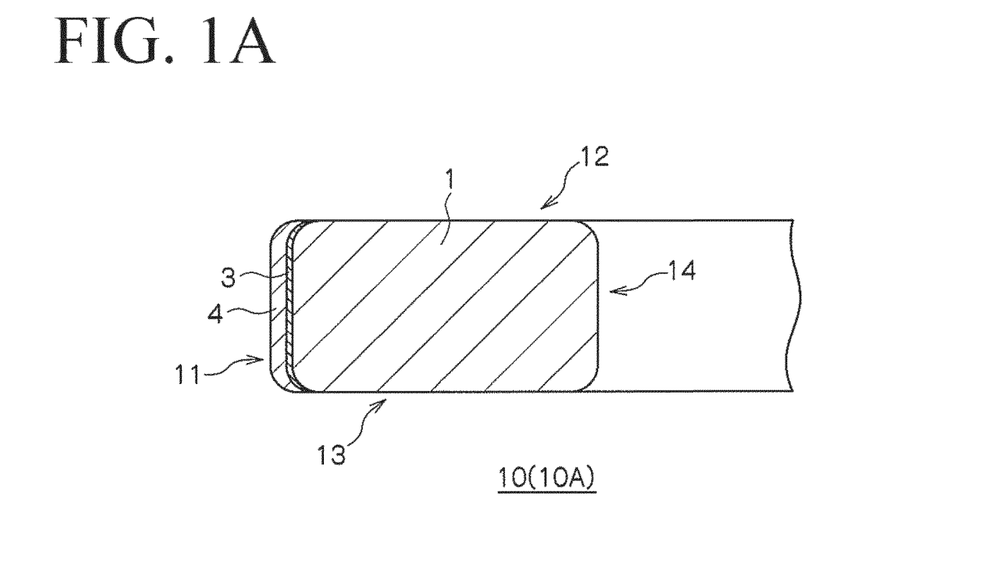
FIGS. 1A and 1B are schematic cross-sectional views illustrating examples of a piston ring according to the present invention.
Figure 1B:
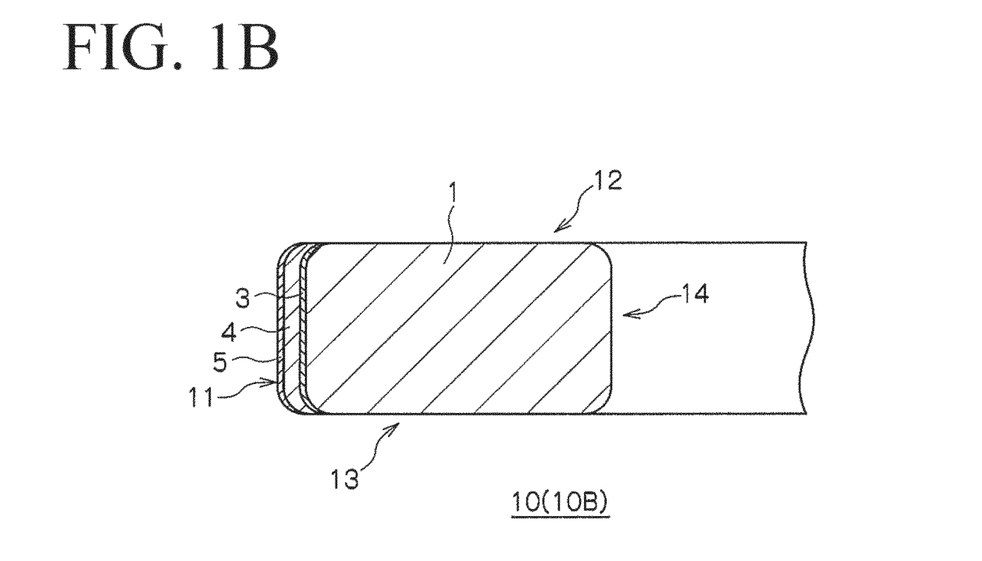
Figure 2:
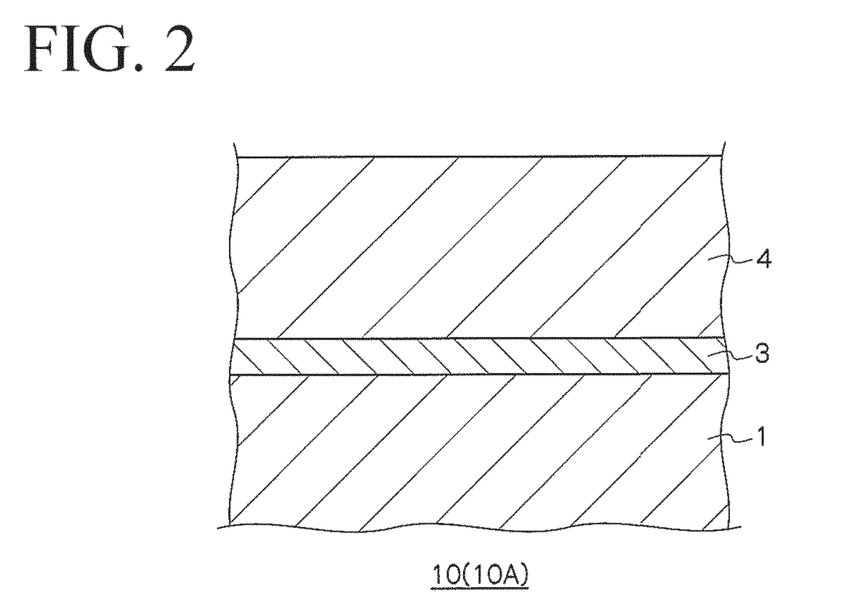
FIG. 2 is a schematic cross-sectional view illustrating an example of a sliding surface of the piston ring according to the present invention.
Figure 3:
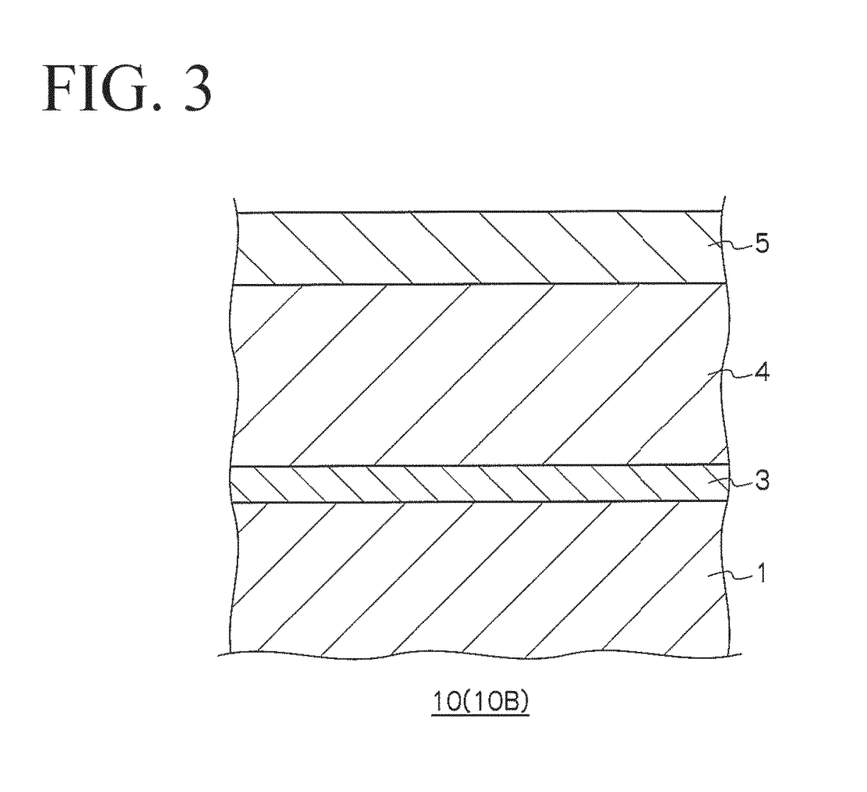
FIG. 3 is a schematic cross-sectional view illustrating another example of the sliding surface of the piston ring according to the present invention.

In the present invention, an outermost surface film 5 may be further provided on the hard carbon film 4, as necessary. The outermost surface film 5 is obtained by laminating a thin hard carbon film (nano-thin film) as illustrated in FIGS. 3 and 4B, similar to the hard carbon film 4 described above. This outermost surface film 5 can act so as to further increase the initial running-in property.

The outermost surface film 5 may be formed by repeating a high bias voltage process and a low bias voltage process by an arc ion plating method at a predetermined interval a plurality of times, similar to the above-mentioned hard carbon film 4. For example, the outermost surface film 5 may be formed by repeatedly performing a high bias voltage process with the pulse bias voltage within a range of −2000 V to −800 V, and a low bias voltage process with the pulse bias voltage within a range of −200 V to −100 V, at a predetermined interval a plurality of times while maintaining an arc current at the same 100 A to 150 A level as in the film-forming conditions of the hard carbon film 4. The "predetermined interval" is an interval of about 1 second to 10 seconds inclusive. The outermost surface film 5 thus formed has high hardness and increased toughness, preventing cracks and flows and improving the initial running-in property.

The outermost surface film 5 is formed so that the total thickness thereof is within a range of about 0.05 μm to 1 μm inclusive. When the thickness is too thin, the problem arises that the initial running-in property effect is not achieved. On the other hand, when the thickness is too thick, the initial running-in property effect does not change. It should be noted that the thickness of each layer constituting the outermost surface film 5 is within a range of about 0.01 μm to 0.02 μm inclusive, and the outermost surface film 5 is configured by laminating a plurality of layers having thicknesses within this range. Such a thickness of the outermost surface film 5 can be measured by a transmission electron microscope (TEM). The hardness after such processing of the outermost surface film 5 is suitably formed to about 2000 HV (0.05) by Vickers hardness.

As described above, the piston ring 10 according to the present invention contains boron in the hard carbon film 4, which is a laminated film, within the range of the above-described atomic density, making it possible to further increase wear resistance.

EXAMPLES

The following describes the piston ring according to the present invention in further detail using examples, comparative examples, and conventional examples.

Example 1

The piston ring base material 1 equivalent to a SWOSC-V material in JIS standards, comprising C: 0.55 mass %, Si: 1.35 mass %, Mn: 0.65 mass %, Cr: 0.70 mass %, Cu: 0.03 mass %, P: 0.02 mass %, S: 0.02 mass %, and the remainder being iron and unavoidable impurities, was used. A 30-μm Cr—N coating (wear-resistant coating) was formed by an ion plating method on this piston ring base material 1. The surface roughness was adjusted by lapping and polishing, and a titanium film having a thickness of 0.08 μm was subsequently formed as the foundation film 2 upon introducing an inert gas (Ar) by an ion plating method.

The hard carbon foundation film 3 comprising an amorphous carbon film was formed on the foundation film 2. The film was formed at an arc current of 90 A and a pulse bias voltage of −130 V under the conditions of 12 minutes in a high vacuum chamber of 1.0×10⁻³ Pa or less using an arc ion plating device and a carbon target containing 5 atom % of boron so as to achieve a thickness of 0.2 μm.

The hard carbon film 4 containing boron and comprising a laminated film was formed on the hard carbon foundation film 3 using the same arc ion plating device. This film was formed by establishing an arc current of 120 A and alternately applying a predetermined low bias voltage and a predetermined high bias voltage in pulses. Specifically, the film was formed by applying a −150-V low bias voltage and a −1800-V high bias voltage in pulses, for 1 second each (total: 320 minutes).

The total thickness of the hard carbon film 4 was 2.7 μm, and the thickness per layer was approximately 0.2 nm. The boron in the hard carbon film 4 had an atomic density of $1.5 \times 10^{22}$ atoms/cm³ by D-SIMS secondary ion mass spectrometry measurement. The hydrogen content of the hard carbon film 4 was 1.5 atom % based on measurement results by an RBS/HFS method. This RBS/HFS method is an abbreviation for Rutherford backscattering spectrometry (RBS) and hydrogen forward scattering spectrometry (HFS). As shown in Table 1, the $sp^2$ component ratio was measured in 10 locations at an equal interval in the thickness direction of the film. As a result, the average of the $sp^2$ component ratio was 64.4%. It should be noted that Table 1 indicates the $sp^2$ component ratio for both graphite and diamond. The area ratio of macroparticles appearing on the surface of the hard carbon film 4 was 2.0%. FIG. 5 is a surface image showing the macroparticles of the hard carbon film 4. The Vickers hardness of the obtained hard carbon film 4 was 1466 HV (0.05). A Vickers hardness tester (manufactured by Future-Tech) was used for measurement. Further, the indentation hardness $H_{IT}$ (15-mN load) that was the surface hardness of the hard carbon film 4 when measured using the nanoindenter manufactured by Elionix was 15.9 GPa.

TABLE 1

|  | Analysis Point | Peak Area (near 285 eV) | Peak Area (280 to 310 eV) | Area Ratio | $sp^2$ Component Ratio |
|---|---|---|---|---|---|
| Example 1 | 1 | 1.06 | 22.96 | 0.046 | 44 |
|  | 2 | 1.47 | 23.60 | 0.062 | 61 |
|  | 3 | 1.53 | 23.50 | 0.065 | 64 |
|  | 4 | 1.59 | 24.00 | 0.066 | 65 |
|  | 5 | 1.56 | 23.54 | 0.066 | 65 |
|  | 6 | 1.66 | 23.62 | 0.070 | 69 |
|  | 7 | 1.73 | 23.94 | 0.072 | 71 |
|  | 8 | 1.61 | 23.69 | 0.068 | 67 |
|  | 9 | 1.67 | 23.78 | 0.070 | 69 |
|  | 10 | 1.33 | 22.43 | 0.070 | 69 |
| Graphite |  — | 2.33 | 23.41 | 0.100 | 100 |
| Diamond |  — | 0.11 | 21.91 | 0.005 | 0 |

Example 2

The carbon target containing 2 atom % of boron was used in Example 1. All other items were the same as in Example 1, and a piston ring of the example was obtained.

The total thickness of the hard carbon film 4 was 3.0 μm, and the thickness per layer was approximately 10 nm. The boron in the hard carbon film 4 had an atomic density of $0.2 \times 10^{22}$ atoms/cm³ by D-SIMS secondary ion mass spectrometry measurement. The hydrogen content of the hard carbon film 4 was 1.3 atom % based on measurement results by an RBS/HFS method. The area ratio of macroparticles appearing on the surface of the hard carbon film 4 was 5.7%. The Vickers hardness of the obtained hard carbon film 4 was 1425 HV (0.05). The indentation hardness $H_{IT}$ (15-mN load) of the hard carbon film 4 was evaluated in the same way as in Example 1, and was 15.4 GPa.

Reference Example 1

The hard carbon foundation film 3 and the hard carbon film 4 were formed using the carbon target that did not contain boron in Example 1. All other items were the same as in Example 1, and a piston ring of Reference Example 1 was obtained.

The total thickness of the hard carbon film 4 was 4.7 μm, and the thickness per layer was approximately 0.2 nm. The hard carbon film 4 did not contain boron. The hydrogen content of the hard carbon film 4 was 0.3 atom % based on measurement results by an RBS/HFS method. The $sp^2$ component ratio, as measured at two points, was 52% at analysis points on the surface side. The area ratio of macroparticles appearing on the surface of the hard carbon film 4 was 3.1%. The Vickers hardness of the obtained hard carbon film 4 was 1710 HV (0.05). The indentation hardness $H_{IT}$ (15-mN load) of the hard carbon film 4 was evaluated in the same way as in Example 1, and was 18.5 GPa.

[Measurement of $sp^2$ Component Ratio]

The $sp^2$ component ratio was calculated by the following steps (1) to (5). (1) The EELS spectrum is measured by an EELS analyzer (manufactured by Gatan; model 863GIF Tridiem). The pre-peak area is fit using a linear function, and the post-peak area is fit using a cubic function to the measured EELS spectrum to standardize the peak intensity. (2) Subsequently, the diamond data and the graphite data are compared, and the energy is calibrated with the peak start position aligned. (3) The surface area within a range of 280 eV to 310 eV is found for the calibrated data. (4) The area is divided into two peaks (one being an $sp^2$ peak and the other being a CH and an amorphous peak) within a range of 280 eV to 295 eV, and the peak area near 285 eV is found. (5) The ratio of the surface area within the 280 eV to 310 eV range of (3) above, and the peak area near 285 eV of (4) above is determined. For this ratio, the $sp^2$ component ratio is found from relative values given a graphite value of 100 and a diamond value of 0. The value thus found is the $sp^2$ component ratio. 10 locations at an equal interval in the thickness direction of the hard carbon film 4 were analyzed.

[Friction and Wear Test (SRV Test)]

A Cr—N coating (wear-resistant coating), a titanium film (the foundation film 2), the hard carbon foundation film 3, and the hard carbon film 4 were formed in that order in the same manner as in Example 1 and Reference Example 1 on the surface (outer peripheral sliding surface 11) of the piston ring base material 1 (material equivalent to an SWOSC-V material in JIS standards, material of Example 1) having a ring diameter φ of 80 mm. The obtained sample was subjected to a friction and wear test (SRV test; Schwingungs Reihungund and Verschleiss) in the mode illustrated in FIG. 7, and the presence/absence of abrasion was observed.

The test conditions were as follows. The piston ring was cut to a length of 20 mm and used as a sliding side test piece (pin-type test piece) 20. As an opposing side test piece (disk-type test piece) 21, a test piece having a 24-mm diameter and a 7.9-mm length (with a hardness of HRC 62 or greater) was cut from SUJ2 steel specified as high carbon chromium bearing steel material in JIS G4805 and used to implement an SRV test under the conditions below. It should be noted that the symbol Y in FIG. 7 denotes a sliding direction, and a sliding width in the sliding direction was set to 3 mm.

Tester: SRV tester (refer to FIG. 7)
 Load: 500 N, 1000 N
 Frequency: 50 Hz
 Test temperature: 80° C.
 Sliding width: 3 mm
 Lubricant: 5W-30, 125 mL/hr
 Test time: 10 minutes, 60 minutes, 120 minutes FIGS. 8A to 8D are images showing the SRV test results. FIG. 8A shows the 10-minute test results at 1000 N using the sample of Example 1. FIG. 8B shows the 60-minute test results at 1000 N using the sample of Example 1. FIG. 8C shows the 120-minute test results at 1000 N using the sample of Example 1. FIG. 8D shows the 10-minute test results at 1000 N using the sample of Reference Example 1. The sample of Example 1 showed remarkably excellent wear resistance despite the thin thickness of 2.7 µm, without the advance of abrasion even in the 120-minute test at 1000 N. On the other hand, the sample of Reference Example 1 showed high wear resistance without abrasion in the 10-minute test at 500 N, but resulted in abrasion in the 10-minute test at 1000 N.

Figure 7:
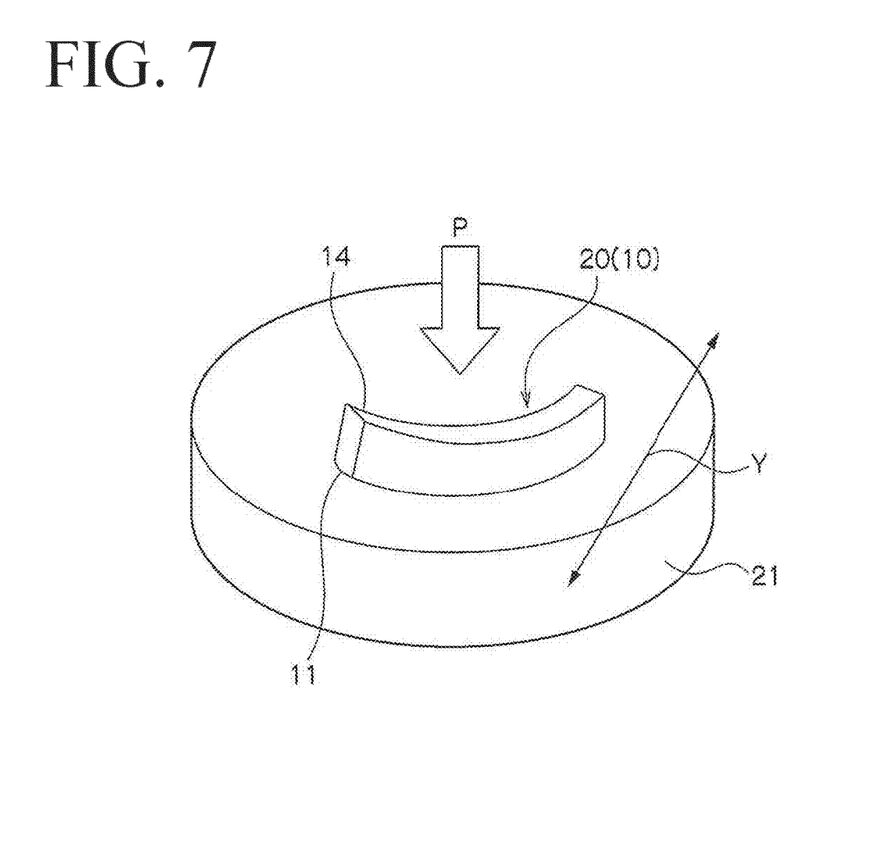
FIG. 7 is a schematic diagram of the principle of a friction and wear test using a disk-type test piece.
Figure 8A:
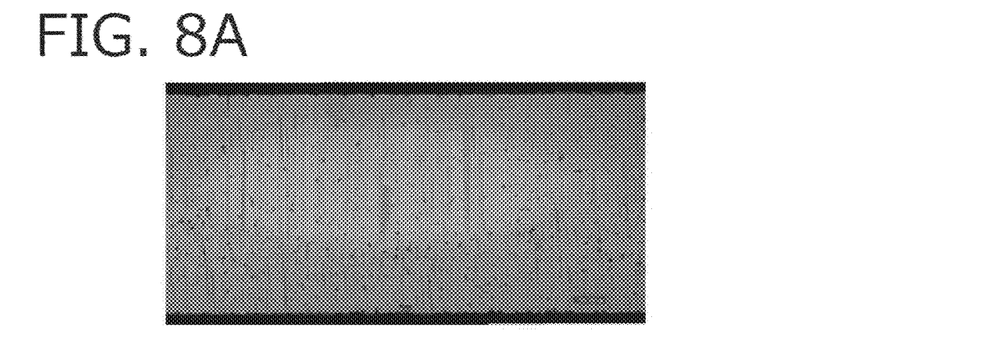
FIGS. 8A, 8B, 8C and 8D are images showing SRV test results.
Figure 8B:
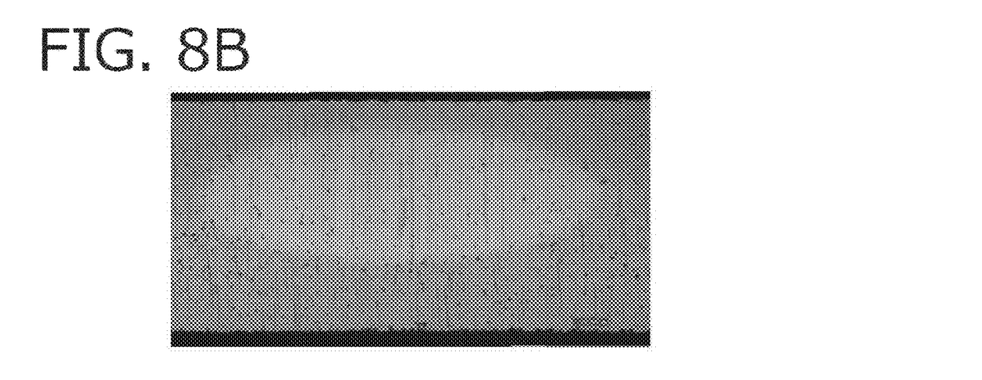
Figure 8C:
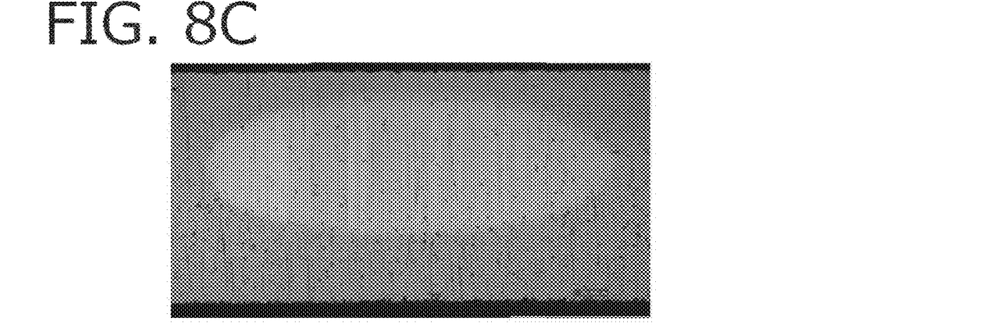
Figure 8D:
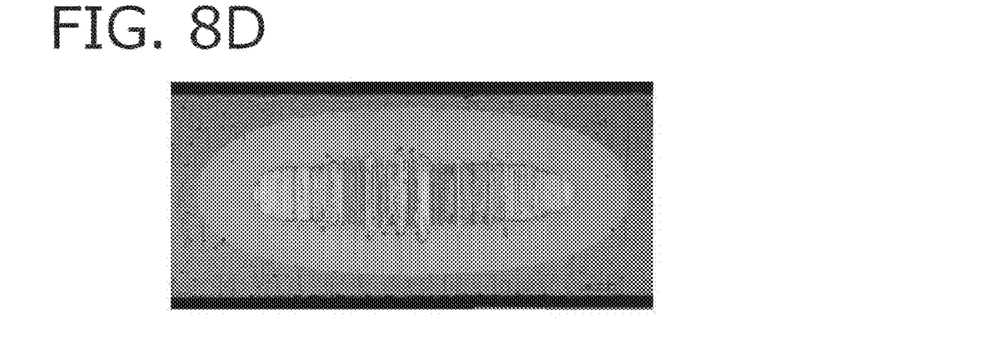
Figure 9A:
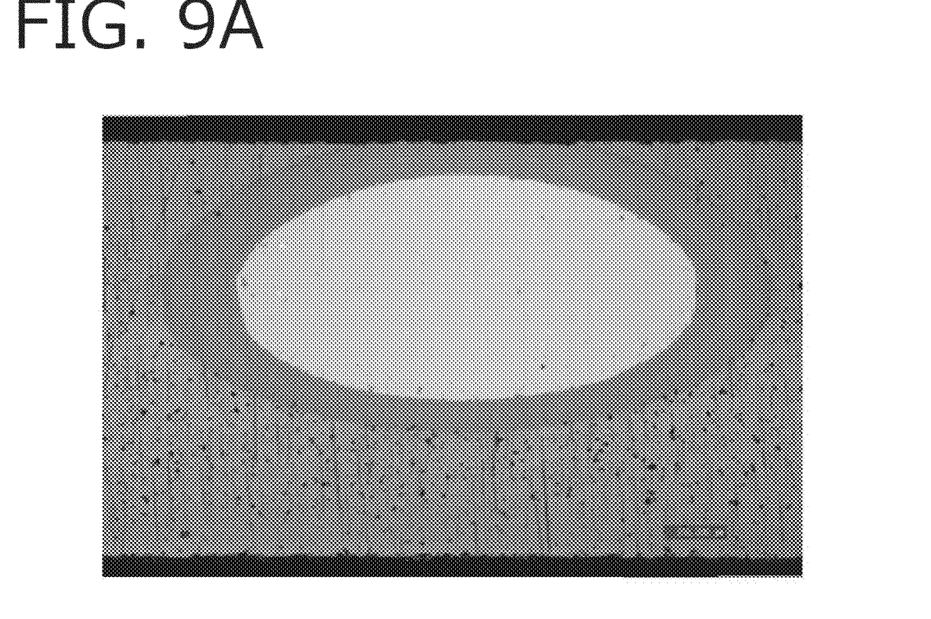
FIGS. 9A and 9B are images showing SRV test results when the test piece was subjected to accelerated wearing by a diamond (average particle size: 0.25 μm) slurry.
Figure 9B:
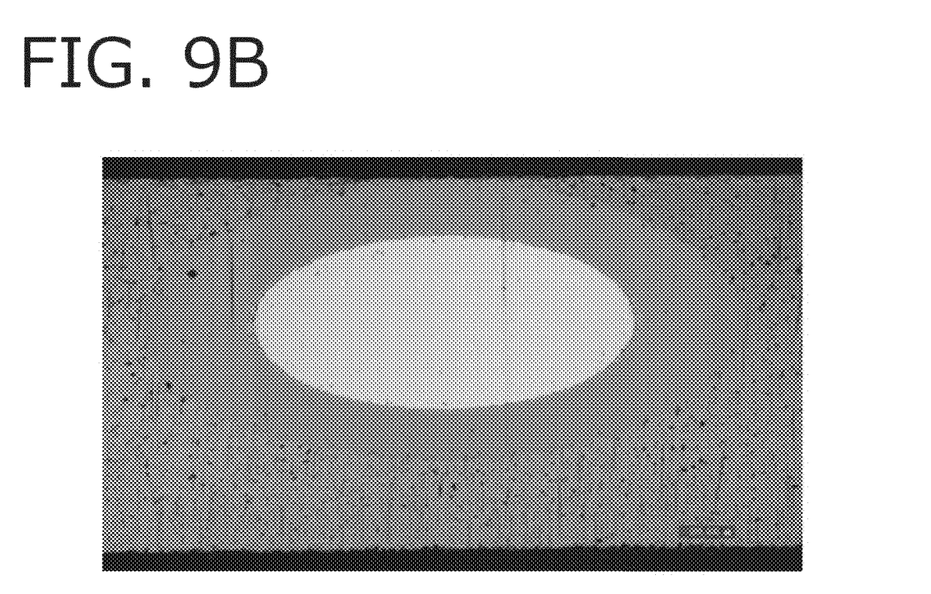

FIGS. 9A and 9B are images showing the results of the SRV test illustrated in FIG. 7 when the sample was subjected to accelerated wearing by a slurry that contains diamond particles having an average particle size of 0.25 µm. FIG. 9A shows the 3-minute test results at 20 N using the sample of Example 1. FIG. 9B shows the 3-minute test results at 20 N using the sample of Reference Example 1. The sample of Example 1 showed excellent durability without swelling or peeling.

It should be noted that the Vickers hardness of the hard carbon film 4 in Example 1 was 1466 HV (0.05) while the Vickers hardness of the hard carbon film 4 in Reference Example 1 was 1710 HV (0.05). While the hard carbon film 4 in Example 1 contained boron and is thus considered to have reduced hardness, the hard carbon film 4 had excellent wear resistance and is therefore considered to be improved in toughness.

[Boron Quantitative Analysis]

The boron atomic density is quantified based on sensitivity in the hard carbon film 4 by D-SIMS secondary ion mass spectrometry measurement as in Examples 1 and 2 described above. While the content of boron should be calculated using the atomic density of the hard carbon film 4 that does not contain boron as standard, the content is calculated using the known atomic density ($1.76 \times 10^{23}$ atoms/cm$^3$) of a diamond as the atomic density of the hard carbon film 4. As a result, an approximate value of 8.52 atom % was obtained for the measured sample in Example 1, and an approximate value of 1.80 atom % was obtained for the measured sample in Example 2.

DESCRIPTIONS OF REFERENCE NUMERALS

1 Piston ring base material
2 Foundation film
3 Hard carbon foundation film
4 Hard carbon film (Nano-laminated film)
5 Outermost surface film (Nano-laminated film)
10, 10A, 10B, 10C, 10D Piston ring
11 Sliding surface (Outer peripheral sliding surface)
12 Top surface
13 Bottom surface
14 Inner peripheral surface
20 Sliding side test piece (Pin-type test piece)
21 Opposing side test piece (Disk-type test piece)
P Load

What is claimed is:

1. A piston ring comprising a hard carbon film formed on at least an outer peripheral sliding surface of a piston ring base material;
    the hard carbon film being a laminated film comprising a plurality of layers,
    individual layers being the plurality of layers formed by repeatedly changing the film-forming conditions,
    and the hard carbon film being configured so as to contain boron within a range of an atomic density of $0.2 \times 10^{22}$ atoms/cm$^3$ to $2.0 \times 10^{22}$ atoms/cm$^3$ inclusive, wherein a hydrogen content of the hard carbon film is within a range of 0.1 atom % inclusive to 5 atom % exclusive.

2. The piston ring according to claim 1, wherein
    the hard carbon film is formed by alternately applying at least two different bias voltages in pulses, and
    the hard carbon film has an sp$^2$ component ratio within a range of 40% to 80% inclusive, measured in a TEM-EELS spectrum formed by combining electron energy loss spectroscopy (EELS) with a transmission electron microscope (TEM).

3. The piston ring according to claim 1, wherein
    a total thickness of the hard carbon film is within a range of 0.5 µm to 20 µm inclusive.

4. The piston ring according to claim 1, wherein
    the hard carbon film is formed on a hard carbon foundation film having a thickness within a range of 0.05 µm to 0.5 µm inclusive.

5. The piston ring according to claim 1, wherein
    an amount of macroparticles appearing on a surface of the hard carbon film is within a range of 0.1% to 10% inclusive by area ratio.

6. The piston ring according to claim 1, wherein
    a surface hardness of the hard carbon film is within a range of 10 GPa to 25 GPa inclusive at an indentation hardness $H_{IT}$ (15-mN load) when measured by a nanoindentation method.

\* \* \* \* \*